United States Patent
Wang et al.

(10) Patent No.: US 9,064,691 B2
(45) Date of Patent: Jun. 23, 2015

(54) SEMICONDUCTOR PROCESS

(75) Inventors: Chih-Chun Wang, Tainan County (TW); Chun-Feng Chen, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 539 days.

(21) Appl. No.: 12/855,952

(22) Filed: Aug. 13, 2010

(65) Prior Publication Data

US 2012/0040535 A1 Feb. 16, 2012

(51) Int. Cl.
*H01L 21/31* (2006.01)
*H01L 21/02* (2006.01)

(52) U.S. Cl.
CPC .... *H01L 21/02164* (2013.01); *H01L 21/02126* (2013.01); *H01L 21/02216* (2013.01); *H01L 21/02274* (2013.01); *H01L 21/0234* (2013.01)

(58) Field of Classification Search
CPC ............... H01L 21/02126; H01L 21/02164; H01L 21/02216; H01L 21/02274; H01L 21/0234
See application file for complete search history.

(56) References Cited

U.S. PATENT DOCUMENTS

| | | | |
|---|---|---|---|
| 6,020,274 | A | 2/2000 | Ngo |
| 6,716,740 | B2 | 4/2004 | Wang et al. |
| 6,734,518 | B2 | 5/2004 | Yin et al. |
| 7,557,043 | B2 | 7/2009 | Lin et al. |
| 2001/0032986 | A1 * | 10/2001 | Miyasaka ................... 257/192 |
| 2006/0216952 | A1 * | 9/2006 | Bhanap et al. .............. 438/780 |

* cited by examiner

*Primary Examiner* — Seahvosh Nikmanesh
(74) *Attorney, Agent, or Firm* — Ding Yu Tan

(57) ABSTRACT

A semiconductor process of the present invention is described as follows. A substrate is provided, and a material layer is deposited on the substrate using an organic precursor as a reactant gas. A plasma treatment is conducted immediately after depositing the material layer, wherein plasma is continuously supplied during depositing the material layer and the plasma treatment. A pump-down step is conducted.

13 Claims, 1 Drawing Sheet

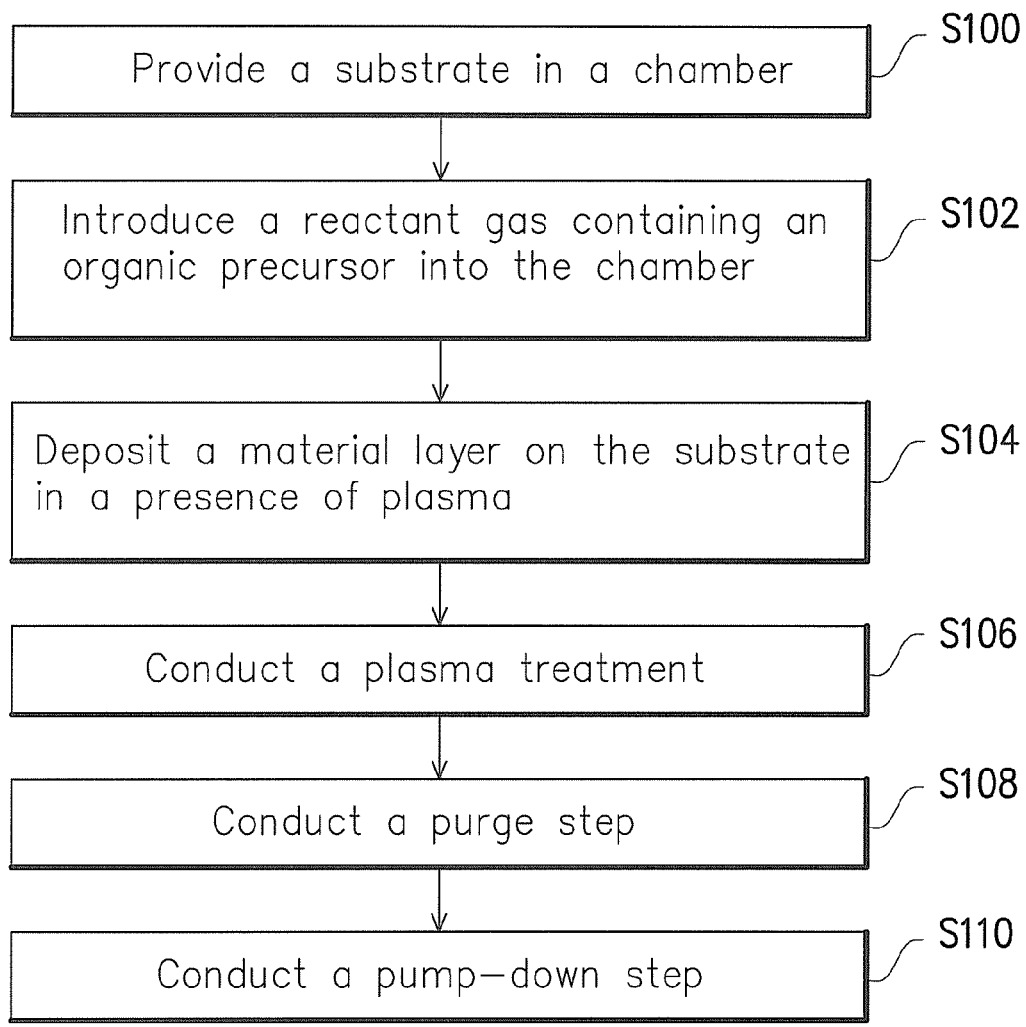

SEMICONDUCTOR PROCESS

BACKGROUND OF THE INVENTION

1. Field of the Invention

The present invention relates to a semiconductor process, and more particularly, to a method for reducing defects of a deposited film.

2. Description of Related Art

Along with rapid progress of semiconductor technology, the dimensions of semiconductor devices are reduced and the integrity thereof promoted continuously to further advance the operating speed and performance of integrated circuits (ICs). As the demand for device integrity is raised, any tiny defects formed on a deposited film have to be considered to avoid a great impact on the operating speed and performance of the circuit.

Nowadays, many material layers are formed through chemical vapor disposition (CVD) in the presence of plasma, which uses a precursor containing organic molecules as a reactant gas. After a demanded material layer is formed on a substrate and reaches the pre-determined thickness, the source for the reactant gas is turned off to stop the deposition. The remaining reactant gas, however, would continue to dissociate and react on the surface of the material layer, thereby forming tiny defects thereon. To describe more in detail, after the disposition process using plasma, dangling bonds formed on the film surface may capture the residual radicals or ionic groups dissociated from the precursor, such that the radicals or ionic groups are prone to congregate and adhere in clusters on the surface of the material layer to form the particles with the size less than 0.05 μm, that is, the tiny defects. These tiny defects may be further exaggerated after forming a subsequent layer on the material layer in the follow-up step. The resultant defects with the size greater than 0.05 μm are formed on the surface of the subsequent layer, and thereby can be detected. As a result, such defects may seriously impact the subsequent process and product reliability.

SUMMARY OF THE INVENTION

Accordingly, the present invention is directed to a semiconductor process which can reduce the number of particles on a deposited material layer, thereby improving film qualities and overall reliability.

A semiconductor process of the present invention is described as follows. A substrate is provided, and a material layer is deposited on the substrate using an organic precursor as a reactant gas. A plasma treatment is conducted immediately after depositing the material layer, wherein plasma is continuously supplied during depositing the material layer and the plasma treatment. A pump-down step is conducted.

According to an embodiment of the present invention, the semiconductor process further includes conducting a purge step between the plasma treatment and the pump-down step.

According to an embodiment of the present invention, the organic precursor includes an organosiloxane-based precursor. The organosiloxane-based precursor is selected from the group consisting of tetraethyl orthosilicate (TEOS; $Si(OC_2H_5)_4$), 1,3,5,7-tetramethylcyclotetrasiloxane (TMCTS; $C_4H_{16}O_4Si_4$), dimethyldimethoxysilane (DMDMOS; $C_4H_{12}O_2Si$) and octamethylcyclotetrasiloxane (OMCTS; $C_8H_{24}O_4Si_4$).

According to an embodiment of the present invention, the organic precursor is supplied from a liquid system through gasification.

According to an embodiment of the present invention, a gas source used for the plasma treatment includes inert gas or oxygen or hydrogen.

According to an embodiment of the present invention, a flow rate of a gas source used for the plasma treatment is within a range of 1000 sccm to 40000 sccm.

According to an embodiment of the present invention, a power used for the plasma treatment is within a range of 100 W to 4000 W.

According to an embodiment of the present invention, a temperature used for the plasma treatment is within a range of 300° C. to 500° C.

According to an embodiment of the present invention, a pressure used for the plasma treatment is within a range of 0.5 Torr to 20 Torr.

A semiconductor process of the present invention is described as follows. A substrate is provided in a chamber. A reactant gas containing an organic precursor is introduced into the chamber. A material layer is deposited on the substrate in a presence of plasma. The reactant gas is turned off and the plasma is supplied continuously during a plasma treatment after the material layer is formed. A pump-down step is conducted.

According to an embodiment of the present invention, the semiconductor process further includes conducting a purge step between the plasma treatment and the pump-down step.

According to an embodiment of the present invention, the organic precursor includes an organosiloxane-based precursor. The organosiloxane-based precursor is selected from the group consisting of tetraethyl orthosilicate (TEOS; $Si(OC_2H_5)_4$), 1,3,5,7-tetramethylcyclotetrasiloxane (TMCTS; $C_4H_{16}O_4Si_4$), dimethyldimethoxysilane (DMDMOS; $C_4H_{12}O_2Si$) and octamethylcyclotetrasiloxane (OMCTS; $C_8H_{24}O_4Si_4$).

According to an embodiment of the present invention, the organic precursor is supplied from a liquid system through gasification.

According to an embodiment of the present invention, a process condition for the plasma treatment is substantially the same as a process condition for depositing the material layer, except the reactant gas.

According to an embodiment of the present invention, the plasma supplied during the plasma treatment is generated by a high-frequency power.

As mentioned above, the semiconductor process according to the present invention includes conducting a plasma treatment immediately after the deposition of the material layer using the organic precursor. Since the plasma is continuously supplied during depositing the material layer and the plasma treatment, the residual radicals or ionic groups dissociated from the organic precursor cannot react with the surface of the material layer. As a result, the formation of tiny defects or clustered particles can be minimized in number. Moreover, the semiconductor process which is carried out by a simple plasma treatment can be easily incorporated into the current fabrication process.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a flow chart illustrating a semiconductor process according to an embodiment of the present invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

The semiconductor process of the present invention is applicable to a film deposition process involving a precursor with relatively low activation energy, e.g. an organic precursor. After a material layer is formed using the organic precursor as a reactant gas, a plasma treatment is conducted immediately after the film deposition, so as to efficaciously eliminate the dangling bonds on the surface of the material layer and thus prevent the residual radicals or ionic groups of the organic precursor from clustering and adhering thereon. It should be noticed that the plasma is continuously supplied during the film deposition and the plasma treatment without interruption.

In details, a gas source used for the plasma treatment at least includes an inert gas or oxygen ($O_2$) or hydrogen ($H_2$), and a flow rate thereof can be within a range of 1000 sccm to 40000 sccm. A power used for the plasma treatment may be within a range of 100 W to 4000 W. A temperature used for the plasma treatment may be within a range of 300° C. to 500° C. A pressure used for the plasma treatment may be within a range of 0.5 Torr to 20 Torr.

The implementation of the present invention is further described in a manner of a flow chart hereinafter. For illustration purposes, the following disclosure is described in terms of fabricating a dielectric film, which is illustrated only as an exemplary example in practice and thereby enables those of ordinary skill in the art to practice this invention, and should not be adopted for limiting the scope of the present invention. FIG. 1 is a flow chart illustrating a semiconductor process according to an embodiment of the present invention.

Referring to FIG. 1, in step S100, a substrate is provided. The substrate is placed in a deposition chamber, such as a chemical vapor deposition (CVD) chamber with plasma assistance. The substrate can be a semiconductor wafer, e.g. an N- or P-type silicon wafer, whereon thin films, conductive parts, or even semiconductor devices may be formed. In an embodiment, a process pressure and a process temperature are further set in the deposition chamber, so as to obtain an appropriate deposition condition for subsequent procedures. The process pressure for film deposition may be within a range of 0.5 Torr to 20 Torr, possibly 5 Torr. The process temperature for film deposition may be within a range of 300° C. to 500° C., possibly 400° C.

In step S102, a reactant gas is introduced into the chamber, wherein the reactant gas contains an organic precursor, which may be supplied from a liquid system through gasification. The organic precursor having relatively low activation energy is, for example, an organosiloxane-based precursor which can be selected from the group consisting of tetraethyl orthosilicate (TEOS; $Si(OC_2H_5)_4$), 1,3,5,7-tetramethylcyclotetrasiloxane (TMCTS; $C_4H_{16}O_4Si_4$), dimethyldimethoxysilane (DMDMOS; $C_4H_{12}O_2Si$) and octamethylcyclotetrasiloxane (OMCTS; $C_8H_{24}O_4Si_4$). In an embodiment, when TEOS is selected as the organic precursor, the reactant gas may further contain oxygen ($O_2$). An inert gas, such as helium (He), argon (Ar) or nitrogen ($N_2$), may also be introduced into the chamber as a carrier gas or a diluting gas during the step S102.

Afterwards, plasma is generated in the chamber, and the decomposed reactant gas reacts on the substrate to deposit a material layer in the presence of the plasma (step S104). The material layer can be made of silicon oxide or a low-k material with a dielectric constant less than 4, depending on the chosen organic precursor. In an embodiment, radio frequency (RF) power is applied to the chamber for generating the plasma, wherein a high-frequency power and a low-frequency power may be utilized simultaneously during the deposition process. The applied high-frequency power is, for instance, within a range of 100 W to 4000 W, possibly about 280 W of the high-frequency power and 60 W of the low-frequency power.

In step S106, after the material layer is formed on the substrate and reaches the pre-determined thickness, the organic precursor source for the reactant gas is turned off, while the plasma is continuously supplied to the deposition chamber, so as to conduct a plasma treatment in situ. As the organic precursor source is turned off, the deposition of the material layer is stopped, such that the plasma treatment is conducted directly after the deposition of the material layer to avoid the formation of the defects. In practice, during the plasma treatment, the low-frequency power can be turned off, but the high-frequency power is still provided. The high-frequency power during the plasma treatment can be the same as that during the deposition of the material layer, i.e. within the range of 100 W to 4000 W, preferably about 280 W. Accordingly, the plasma is continuously supplied during the material layer deposition and the subsequent plasma treatment without interruption therebetween.

The time period or duration of conducting the plasma treatment is, for example, greater than 0 second, preferably about 3 seconds. The flow rate of the gas provided in the plasma treatment can be within a range of 1000 sccm to 40000 sccm, preferably about 9000 sccm. The temperature used for the plasma treatment may be within a range of 300° C. to 500° C., preferably about 400° C. The pressure used for the plasma treatment may be within a range of 0.5 Torr to 20 Torr, preferably about 5 Torr. Alternatively, in an embodiment, the organic precursor source and the oxygen ($O_2$) source for the reactant gas can both be turned off, while the carrier gas source is supplied continuously during the plasma treatment. That is to say, the process condition for the plasma treatment can be substantially the same as the process condition for depositing the material layer, except for the reactant gas source.

After the step S106, a purge step can be optionally conducted (step S108). During the purge step, the plasma is not provided anymore. In an embodiment, the high-frequency power supply is turned off, while the carrier gas source is still provided. The carrier gas source can function as the purge gas injected into the deposition chamber for purging the chamber from the remaining reactant gas or impurities. The duration of conducting the purge step is, for example, within a range of 0 seconds to 10 seconds, preferably about 3 seconds. In addition, the flow rate of the purge gas during the purge step is usually about 1000 sccm to 40000 sccm, preferably about 9000 sccm. At this moment in the process, the pressure and the temperature in the chamber may be both identical with the process pressure and the process temperature that are set previously.

In step S110, a pump-down step is conducted, so as to pump down the pressure in the chamber to a base pressure less than about 0.2 Torr. After the pump-down step is finished, the substrate may wait to be transferred out from the deposition chamber for further processes to complete fabrication of demanded semiconductor devices, which are well appreciated by persons skilled in the art, and thus, the detailed descriptions thereof are not described herein.

It should be noted that once the material layer is deposited as desired, the plasma treatment is performed with the uninterrupted plasma. Since the material layer is exposed to the continuously-supplied plasma treatment, the dangling bonds on the surface of the material layer can be bombarded and thus eliminated. Accordingly, the residual radicals or ionic groups dissociated from the organic precursor would not react with or adhere to the surface of the material layer, such that the formation of tiny defects, e.g. clustered particles, can be effectively minimized in number. In other words, after the advantageous semiconductor process illustrated above, the resultant material layer with minimized number of defects or particles formed thereon can be obtained owing to the uninterrupted plasma provision (i.e. plasma treatment) immediately after the deposition of the material layer. It is also emphasized that if there is an idle of plasma provision between the plasma treatment and the deposition of the material layer, the interrupted plasma treatment would scarcely exhibit the foregoing efficacy of reducing the defects.

Moreover, the above embodiment in which the material layer is exposed to the plasma of the carrier gas is provided for illustration purposes, and should not be construed as limiting the scope of the disclosure. Certainly, in other embodiments, plasma of other gases can also be utilized in the plasma treatment as long as the provision of plasma is continuous during deposition of the material layer and the plasma treatment. Other applications and modifications should be apparent to those of ordinary skill in the art according to the above-mentioned embodiment, and are not specifically restricted in the present invention.

To substantiate the outstanding efficacy of the plasma treatment in the semiconductor process, actual measurement of the defects formed on the surface of the material layer according to several examples will be described hereinafter. It should be appreciated that the following examples are provided merely to illustrate the effects upon the reduction of the defects in the present invention, but are not intended to limit the scope of the present invention.

Table 1 depicts testing results that are represented by count number of the particles with the size greater than 0.05 μm formed on the material layers implemented by the abovementioned method respectively according to Examples 1-3 and Comparative Examples 1-2.

TABLE 1

| | Organic precursor | Idle (second) | He plasma treatment (second) | He purge (second) | Particles (size >0.05 μm) (EA) |
|---|---|---|---|---|---|
| Example 1 | TEOS | 0 | 3 | 0 | 40 |
| Example 2 | TEOS | 0 | 3 | 3 | 15 |
| Example 3 | TEOS | 0 | 3 | 10 | 23 |
| Comparative Example 1 | TEOS | 0 | 0 | 3 | ~10000 |
| Comparative Example 2 | TEOS | 1 | 3 | 3 | ~10000 |

In Table 1, Example 1 stands for the condition that a plasma treatment is conducted immediately after a film deposition without an idle of plasma provision therebetween, but a subsequent purge step is absent before a pump-down step. Likewise, Examples 2 and 3 stand for the conditions that the plasma treatment is conducted immediately after the film deposition without an idle of plasma provision therebetween, and the subsequent purge step is then conducted before a pump-down step. Comparative Example 1 stands for the condition that only the purge step is conducted between the film deposition and the pump-down step without any plasma treatment. Comparative Example 2 stands for the condition that the plasma treatment and the purge step are conducted in sequence between the film deposition and the pump-down step, but there is an idle of plasma provision between the plasma treatment and the film deposition.

As shown in Table 1, it is obvious in Examples 1-3 that the continuous plasma treatment can effectively reduce the number of particles as compared with Comparative Example 1, while the absence of the purge step merely makes a minor impact on particles reduction. According to the comparison between Example 2 and Comparative Example 2, the idle of plasma provision between the plasma treatment and the film deposition would ruin the outstanding effect of plasma treatment upon particles reduction. Based on the above results, the plasma treatment has to be conducted directly after the film deposition with continuously-provided plasma, and the purge step after the plasma treatment can be optionally selected as a procedure to further minimize the particle formation.

In view of the above, the semiconductor process according to an embodiment of the present invention includes conducting a plasma treatment immediately after the deposition of the material layer using the organic precursor. Once the material layer is exposed to the continuously-supplied plasma treatment, the dangling bonds on the surface of the material layer can be eliminated, and it is thus difficult for the residual radicals or ionic groups dissociated from the organic precursor to adhere thereon. Hence, the number of tiny defects or clustered particles can be effectively reduced, and the resultant material layer can possess improved film qualities which benefits greatly by the plasma treatment.

In addition, the semiconductor process of the present invention relies on the plasma treatment through the continuous provision of plasma between the film deposition and the pump-down step, so as to easily be incorporated into the current process. Thus, not only the process is simple, the product reliability can be more effectively enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor process, comprising the following steps in the sequence set forth:
providing a substrate;
providing a reactant gas and a carrier gas with a plasma treatment to deposit a material layer on the substrate;
terminating providing the reactant gas while keeping providing the carrier gas with the plasma treatment after the material layer is deposited to a predetermined thickness; and
conducting a pump-down step.

2. The semiconductor process according to claim 1, further comprising conducting a purge step between the plasma treatment and the pump-down step.

3. The semiconductor process according to claim 1, wherein the reactant gas comprises an organic precursor, and the organic precursor comprises an organosiloxane-based precursor.

4. The semiconductor process according to claim 3, wherein the organosiloxane-based precursor is selected from the group consisting of tetraethyl orthosilicate (TEOS; Si(OC2H5)4), 1,3,5,7-tetramethylcyclotetrasiloxane (TMCTS; C4H16O4Si4), dimethyldimethoxysilane (DMDMOS; C4H12O2Si) and octamethylcyclotetrasiloxane (OMCTS; C8H24O4Si4).

5. The semiconductor process according to claim 1, wherein the reactant gas comprises a organic precursor, and the organic precursor is supplied from a liquid system through gasification.

6. The semiconductor process according to claim 1, further comprising providing a gas source comprising the reactant gas and the carrier gas, wherein the gas source comprises inert gas or oxygen or hydrogen.

7. The semiconductor process according to claim 1, further comprising providing a gas source comprising the reactant gas and the carrier gas, wherein a flow rate of the gas source is within a range of 1000 sccm to 40000 sccm.

8. The semiconductor process according to claim 1, wherein a power used for the plasma treatment is within a range of 100 W to 4000 W.

9. The semiconductor process according to claim 1, wherein a temperature used for the plasma treatment is within a range of 300° C. to 500° C.

10. The semiconductor process according to claim 1, wherein a pressure used for the plasma treatment is within a range of 0.5 Torr to 20 Torr.

11. The semiconductor process according to claim 1, wherein the plasma is generated with a first radio frequency power and a second radio frequency power having a lower frequency than that of the first radio frequency, and the second radio frequency power is turned off immediately after depositing the material layer.

12. The semiconductor process according to claim 1, wherein the carrier gas comprises helium (He), argon (Ar) or nitrogen (N2).

13. The semiconductor process according to claim 1, wherein the pump-down step is performed after terminating providing the reactant gas while keeping providing the carrier gas with the plasma treatment.

* * * * *